（12）United States Patent
Ueda et al.

(10) Patent No.: US 10,968,925 B2
(45) Date of Patent: Apr. 6, 2021

(54) GAS CYLINDER (71) Applicant: TOKYO ELECTRON LIMITED, Tokyo (JP)

(72) Inventors: Takehiro Ueda, Miyagi (JP); Takeshi Akao, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 15 days.

(21) Appl. No.: 16/028,608

(22) Filed: Jul. 6, 2018

(65) Prior Publication Data

US 2019/0010967 A1 Jan. 10, 2019

(30) Foreign Application Priority Data

Jul. 7, 2017 (JP) .............................. JP2017-133812

(51) Int. Cl.
 *F15B 15/14* (2006.01)
 *F15B 11/036* (2006.01)
 *H01L 21/677* (2006.01)
 *H01L 21/687* (2006.01)

(52) U.S. Cl.
 CPC ...... *F15B 15/1404* (2013.01); *F15B 11/0365* (2013.01); *F15B 15/14* (2013.01); *F15B 2211/3057* (2013.01); *F15B 2211/7056* (2013.01); *F15B 2211/8855* (2013.01); *F15B 2211/89* (2013.01); *H01L 21/67742* (2013.01); *H01L 21/68742* (2013.01)

(58) Field of Classification Search
 CPC ...... F15B 2211/8855; F15B 2211/3057; F15B 2211/7055; F15B 2211/7056; F15B 2211/89; F15B 2211/3138
 See application file for complete search history.

(56) References Cited

U.S. PATENT DOCUMENTS

| | | | | |
|---|---|---|---|---|
| 3,687,013 A | * | 8/1972 | Haller | F15B 11/076 92/8 |
| 3,834,276 A | * | 9/1974 | Gournelle | B29C 51/38 91/51 |
| 4,076,103 A | * | 2/1978 | Wallis | F16F 9/3278 184/25 |
| 4,106,592 A | * | 8/1978 | Siems | F15B 15/1433 184/25 |
| 4,257,311 A | * | 3/1981 | Barnsley | G05D 1/0077 91/363 A |

(Continued)

FOREIGN PATENT DOCUMENTS

| CN | 2509361 Y | 9/2002 |
|---|---|---|
| CN | 200985931 Y | 12/2007 |

(Continued)

*Primary Examiner* — Thomas E Lazo
(74) *Attorney, Agent, or Firm* — Rothwell, Figg, Ernst & Manbeck, P.C.

(57) ABSTRACT

An air cylinder includes a cylinder, a piston rod, a piston, and a controller. The piston rod has one end disposed in the cylinder and the other end protruding from the cylinder. The piston is provided at the one end of the piston rod and moves the piston rod by moving in the cylinder. The controller supplies gas into one of a space, which is a space in the cylinder directed on the piston rod side with respect to the piston, and a space, which is a space in the cylinder opposite to the space with respect to the piston, and sucks gas from an interior of the other of the spaces.

12 Claims, 11 Drawing Sheets

(56) References Cited

U.S. PATENT DOCUMENTS

| | | | | |
|---|---|---|---|---|
| 4,765,225 A * | 8/1988 | Birchard | ............... | F15B 11/076 251/129.1 |
| 5,435,228 A * | 7/1995 | Snitgen | ..................... | F15B 3/00 60/426 |
| 5,542,336 A * | 8/1996 | Larkin | ...................... | F15B 9/03 91/166 |
| 5,615,595 A * | 4/1997 | Davis | .................. | F15B 11/0365 91/440 |
| 6,003,428 A * | 12/1999 | Mundie | ................ | B23K 11/314 91/459 |
| 6,050,172 A * | 4/2000 | Corves | .................... | C03B 9/165 91/450 |
| 6,145,307 A * | 11/2000 | Dantlgraber | .............. | B66F 9/22 60/327 |
| 6,848,641 B2 * | 2/2005 | Lohmann | ............... | B65H 49/16 242/129 |
| 8,677,885 B2 * | 3/2014 | Lauffer | ............... | F15B 15/1409 91/510 |
| 9,387,592 B2 * | 7/2016 | Asai | ...................... | B66C 23/005 |
| 2014/0190346 A1 * | 7/2014 | Landi | .................... | F15B 15/02 91/418 |
| 2016/0091000 A1 * | 3/2016 | Gallino | .................... | H02J 3/382 60/413 |
| 2017/0146034 A1 * | 5/2017 | Landberg | ............ | F15B 11/0365 |
| 2017/0234333 A1 * | 8/2017 | Wirtl | ..................... | F15B 11/006 91/459 |

FOREIGN PATENT DOCUMENTS

| | | | | |
|---|---|---|---|---|
| CN | 201428659 Y | | 3/2010 | |
| JP | H06-323306 A | | 11/1994 | |
| JP | 2003-322109 A | | 11/2003 | |
| WO | WO-2010130288 A1 * | | 11/2010 | ............ F15B 11/126 |

* cited by examiner

GAS CYLINDER

CROSS-REFERENCE TO RELATED APPLICATION

This application is based on and claims priority from Japanese Patent Application No. 2017-133812 filed on Jul. 7, 2017 with the Japan Patent Office, the disclosure of which is incorporated herein in its entirety by reference.

TECHNICAL FIELD

Various aspects and exemplary embodiments of the present disclosure relate to a gas cylinder.

BACKGROUND

An air cylinder, which uses air pressure as a power source, is used to provide power to various devices such as a robot arm. The air cylinder is also used for a semiconductor manufacturing device or a semiconductor transport device in order to provide power to various points. See, for example, Japanese Patent Application Laid-Open No. 2003-322109.

SUMMARY

One aspect of the present disclosure provides a gas cylinder including a cylinder, a piston rod, a piston, and a gas controller. The piston rod has one end disposed in the cylinder and the other end protruding from the cylinder. The piston is provided at the one end of the piston rod and moves the piston rod by moving in the cylinder. The gas controller supplies gas into one of a space, which is a space in the cylinder directed on the side of the piston rod with respect to the piston, and a space, which is a space in the cylinder opposite to the space with respect to the piston, and sucks gas from the interior of the other of the spaces.

The foregoing summary is illustrative only and is not intended to be in any way limiting. In addition to the illustrative aspects, exemplary embodiments, and features described above, further aspects, exemplary embodiments, and features will become apparent by reference to the accompanying drawings and the following detailed description.

DESCRIPTION OF EMBODIMENT

In the following detailed description, reference is made to the accompanying drawings, which form a part thereof. The illustrative exemplary embodiments described in the detailed description, drawings, and claims are not meant to be limiting. Other exemplary embodiments may be utilized, and other changes may be made without departing from the spirit or scope of the subject matter presented here.

Recently, because of multi-functionality or operation complexity of the manufacturing device or the transport device, a plurality of driving devices are provided in the manufacturing device or the transport device. For this reason, the manufacturing device or the transport device tends to be increased in size, and thus there is a need for reduction in size of the device. To realize the reduction in size of the device, it is also important to reduce a size of the air cylinder. However, the reduction in size of the air cylinder causes a decrease in cross-sectional area of a piston and deterioration in thrust of the piston. Therefore, it is difficult to reduce the size of the air cylinder because necessary thrust needs to be ensured.

According to one exemplary embodiment, a disclosed gas cylinder has a cylinder, a piston rod, a piston, and a gas controller. The piston rod has one end disposed in the cylinder and the other end protruding from the cylinder. The piston is provided at one end of the piston rod and moves the piston rod by moving in the cylinder. The gas controller supplies compressed gas into one of a first space, which is a space in the cylinder at the side of the piston rod with respect to the piston, and a second space, which is a space in the cylinder opposite to the first space with respect to the piston, and sucks gas from an interior of the other of the first and second spaces.

According to one exemplary embodiment of the disclosed gas cylinder, a plurality of pistons may be further provided on the piston rod along the piston rod. In addition, partition walls, which divide third spaces surrounded by an inner wall of the cylinder and the two adjacent pistons in an extension direction of the piston rod, may be provided in the cylinder for every two adjacent pistons. In addition, in each of the third spaces, the first space may be a space in the cylinder at the side of one end of the piston rod with respect to the partition wall, and the second space may be a space in the cylinder at the side of the other end of the piston rod with respect to the partition wall.

According to one exemplary embodiment of the disclosed gas cylinder, the gas controller may suck the gas from the interior of the first space and may supply the compressed gas into the second space when the piston rod is moved in a direction in which the other end of the piston rod is moved away from the cylinder.

According to one exemplary embodiment of the disclosed gas cylinder, the gas controller may supply the compressed gas into the first space and may suck the gas from the interior of the second space when the piston rod is moved in a direction in which the other end of the piston rod is moved toward the cylinder.

According to one exemplary embodiment of the disclosed gas cylinder, the gas controller may suck the gas from the space in the cylinder using a vacuum pump.

According to one exemplary embodiment of the disclosed gas cylinder, the gas may be dry air.

According to one exemplary embodiment of the disclosed gas cylinder, a seal member is disposed between the cylinder and the piston rod.

According to one exemplary embodiment of the disclosed gas cylinder, a lubricant is applied on a surface of the outer circumference of the piston rod.

According to one exemplary embodiment, disclosed is a method of operating a gas cylinder including a cylinder, a piston rod having one end disposed in the cylinder and a remaining end protruding from the cylinder, a piston provided at the one end of the piston rod and configured to move the piston rod by moving inside the cylinder. The method includes: supplying a compressed gas into a first space, which is a space in the cylinder on a side of the piston rod with respect to the piston, and sucking gas from an interior of a second space, which is a space in the cylinder opposite to the first space with respect to the piston at the same time, thereby pressing out the piston rod; and supplying a compressed gas into the second space, and sucking gas from an interior of the first space at the same time, thereby pulling back the piston rod.

According to one exemplary embodiment, a disclosed gas cylinder has a cylinder, a piston rod, a plurality of pistons, one or more partition walls, and a gas controller. The piston rod has one end disposed in the cylinder and a remaining end protruding from the cylinder. The plurality of pistons are provided at the one end of the piston rod and at one or more positions between the one end and the remaining end of the piston rod, and are configured to move the piston rod by moving in the cylinder. Each of the one or more partition walls is provided in the cylinder for every two adjacent pistons so as to divide a space surrounded by an inner wall of the cylinder and the two adjacent pistons in an extension direction of the piston rod. The gas controller supplies supply a compressed gas into one of a group of first spaces, which are spaces in the cylinder on a side of the remaining end of the piston rod with respect to each of the pistons, and a group of second spaces, which are spaces in the cylinder opposite to the group of first spaces with respect to the each of the of pistons, respectively, and sucks gas from an interior of the other of the group of first spaces and the group of second spaces.

According to various aspects and exemplary embodiments of the present disclosure, it is possible to increase thrust of the gas cylinder.

Hereinafter, Examples of the disclosed gas cylinder will be described in detail with reference to the drawings. Further, the disclosed gas cylinder is not limited by the following Examples.

Example 1

[Configuration of Air Cylinder 10]

Figure 1:
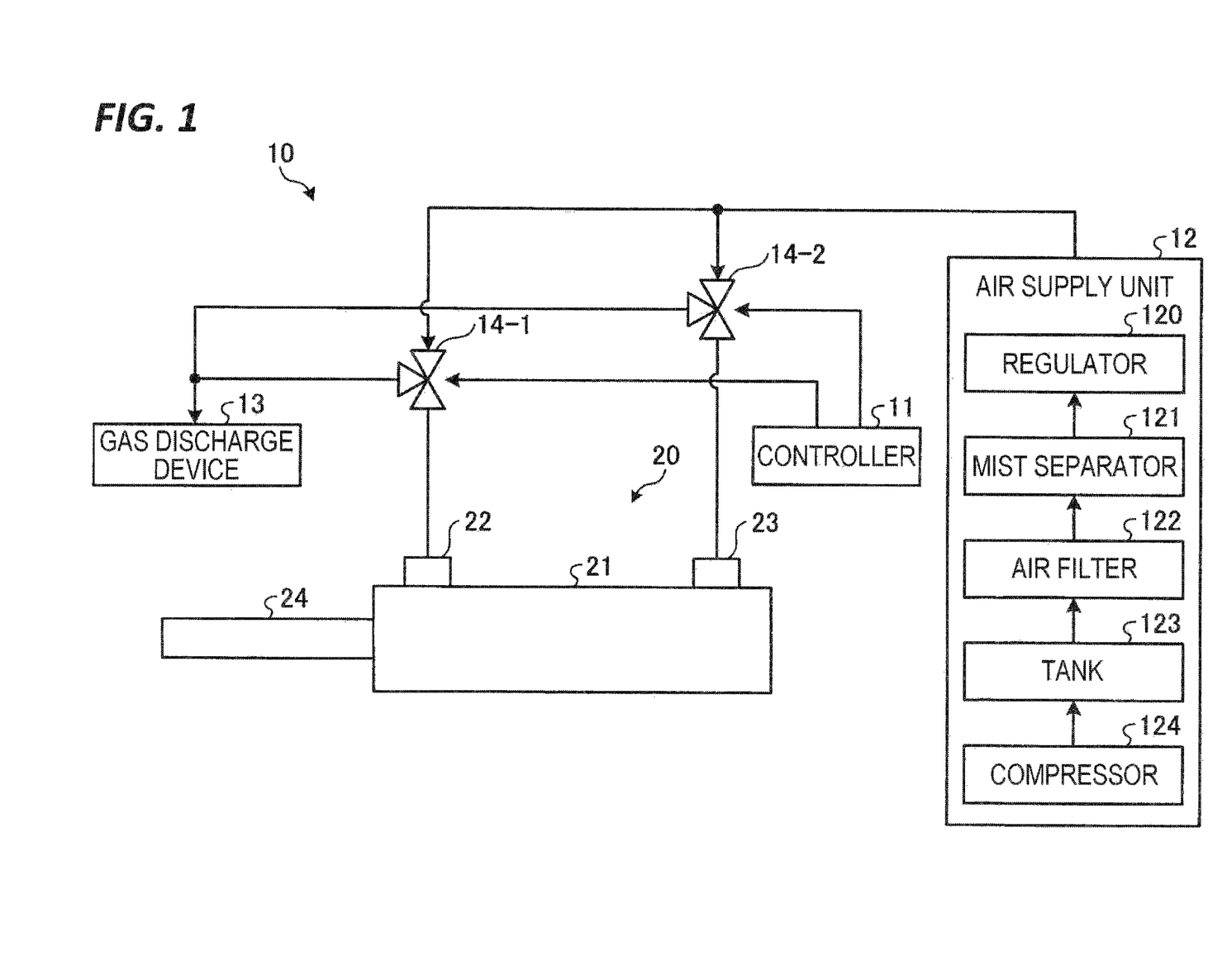
FIG. 1 is a block diagram illustrating an example of an air cylinder according to Example 1.

FIG. 1 is a block diagram illustrating an example of an air cylinder 10 according to Example 1. In the present Example, as illustrated in FIG. 1 for example, the air cylinder 10 has a controller 11, an air supply unit 12, a plurality of valves 14-1 and 14-2, and an air cylinder main body 20. Further, hereinafter, the valves 14-1 and 14-2 are simply referred to as valves 14 when the valves 14-1 and 14-2 are not distinguished from each other but collectively referred. In the present Example, the air cylinder 10 is used for, for example, a drive unit in a transport system for transporting a semiconductor wafer in a device for processing the semiconductor wafer, or a drive unit for a pusher pin for moving a semiconductor wafer upward and downward with respect to a placement table in the processing device. The air cylinder 10 is an example of a gas cylinder.

The air supply unit 12 has a regulator 120, a mist separator 121, an air filter 122, a tank 123, and a compressor 124. The compressor 124 sucks atmospheric air and compresses the sucked air to produce compressed air. The tank 123 stores the compressed air produced by the compressor 124. The air filter 122 removes particles in the compressed air stored in the tank 123. The mist separator 121 produces dry air by removing moisture from the compressed air from which the particles are removed by the air filter 122. The regulator 120 adjusts pressure of the dry air, from which the moisture is removed by the mist separator 121 and which is supplied to the valves 14, to predetermined pressure. Hereinafter, the dry air, which is outputted to the valves 14 from the air supply unit 12, is referred to as compressed air.

The air cylinder main body 20 has a cylinder 21 and a piston rod 24. The cylinder 21 is provided with a port 22 and a port 23, the compressed air is supplied into the cylinder 21 from one of the port 22 and the port 23, and air in the cylinder 21 is sucked from the other of the port 22 and the port 23. In the present Example, the air in the cylinder 21 is sucked by a gas discharge device 13. In the example illustrated in FIG. 1, the air in the cylinder 21 is sucked from the port 22, and the compressed air is supplied into the cylinder 21 from the port 23 such that the piston rod 24 is pushed out from the cylinder 21. Meanwhile, the compressed air is supplied into the cylinder 21 from the port 22, and the air in the cylinder 21 is sucked from the port 23 such that the piston rod 24 is pulled back into the cylinder 21.

For example, the gas discharge device 13 has a vacuum pump such as a dry pump (DP) or a turbo molecular pump (TMP). The gas discharge device 13 may divert a vacuum pump used for a device for processing a semiconductor wafer.

Each of the valves 14 has three ports and a control terminal. In each of the valves 14, one port is connected to the air supply unit 12, another port is connected to the gas discharge device 13, and the remaining port is connected to the air cylinder main body 20. In addition, the control terminal of each of the valves 14 is connected to the controller 11. Each of the valves 14 switches between a first state and a second state based on a control signal supplied to the control terminal from the controller 11. The first state is a state in which the port connected to the air supply unit 12 and the port connected to the air cylinder main body 20 are in communication with each other. The second state is a state in which the port connected to the gas discharge device 13 and the port connected to the air cylinder main body 20 are in communication with each other.

The controller 11 controls the operations of pushing out and pulling back the piston rod 24 with respect to the cylinder 21 by controlling the control signal supplied to the control terminal of each of the valves 14. The controller 11 and the plurality of valves 14 are an example of a gas controller.

[Configuration of Air Cylinder Main Body 20]

Figure 2:
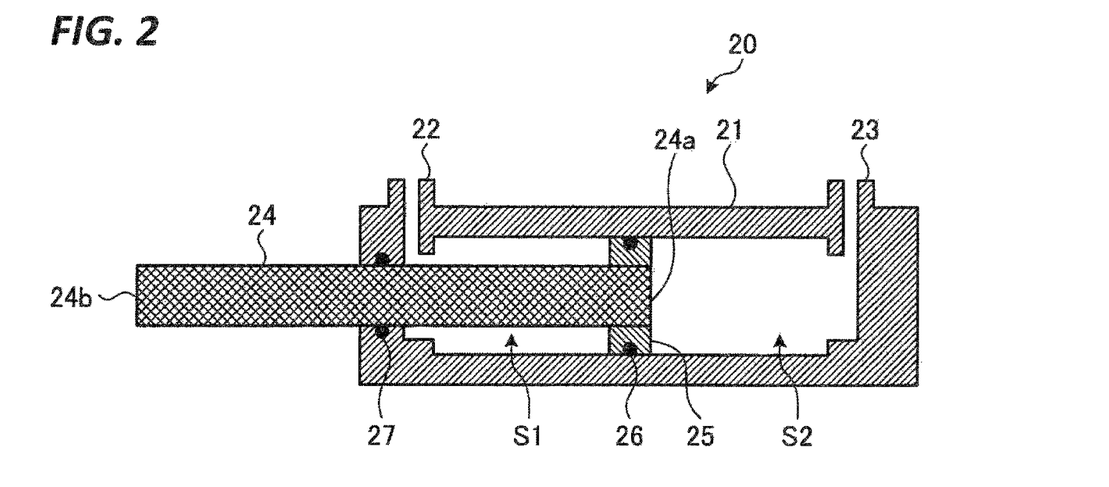
FIG. 2 is a cross-sectional view illustrating an example of an air cylinder main body according to Example 1.

FIG. 2 is a cross-sectional view illustrating an example of the air cylinder main body 20 according to Example 1. In the present Example, the air cylinder main body 20 has the cylinder 21 and the piston rod 24. The cylinder 21 is provided with the port 22 and the port 23. For example, as illustrated in FIG. 2, one end 24a of the piston rod 24 is disposed in the cylinder 21, and the other end 24b of the piston rod 24 protrudes from the cylinder 21. A seal member 27 such as, for example, an O-ring is disposed between the cylinder 21 and the piston rod 24, and hermeticity of a space in the cylinder 21 is maintained by the seal member 27 even when the piston rod 24 moves.

A piston 25 is provided at the one end 24a of the piston rod 24. The piston 25 moves in the cylinder 21 to move the piston rod 24. A diameter of a cross section of the piston 25 in an extension direction of the piston rod 24 is slightly shorter than an inner diameter of the cylinder 21. A seal member 26 such as, for example, an O-ring is provided around an outer circumference of the piston 25, and the seal member 26 is closely attached to the outer circumference of the piston 25 and an inner surface of the cylinder 21. By the piston 25 and the seal member 26, the space in the cylinder 21 is hermetically divided into a space S1 which is at the side of the piston rod 24 with respect to the piston 25, and a space S2 which is opposite to the space S1 with respect the piston 25. The space S1 is in communication with the port 22, and the space S2 is in communication with the port 23. The space S1 is an example of the first space, and the space S2 is an example of the second space.

A lubricant is applied onto the inner wall of the cylinder 21. Therefore, the piston 25 may move in the cylinder 21 in the extension direction of the piston rod 24 while the space S1 and the space S2 are hermetically defined by the seal member 26.

[Operation of Air Cylinder 10]

Figure 3:
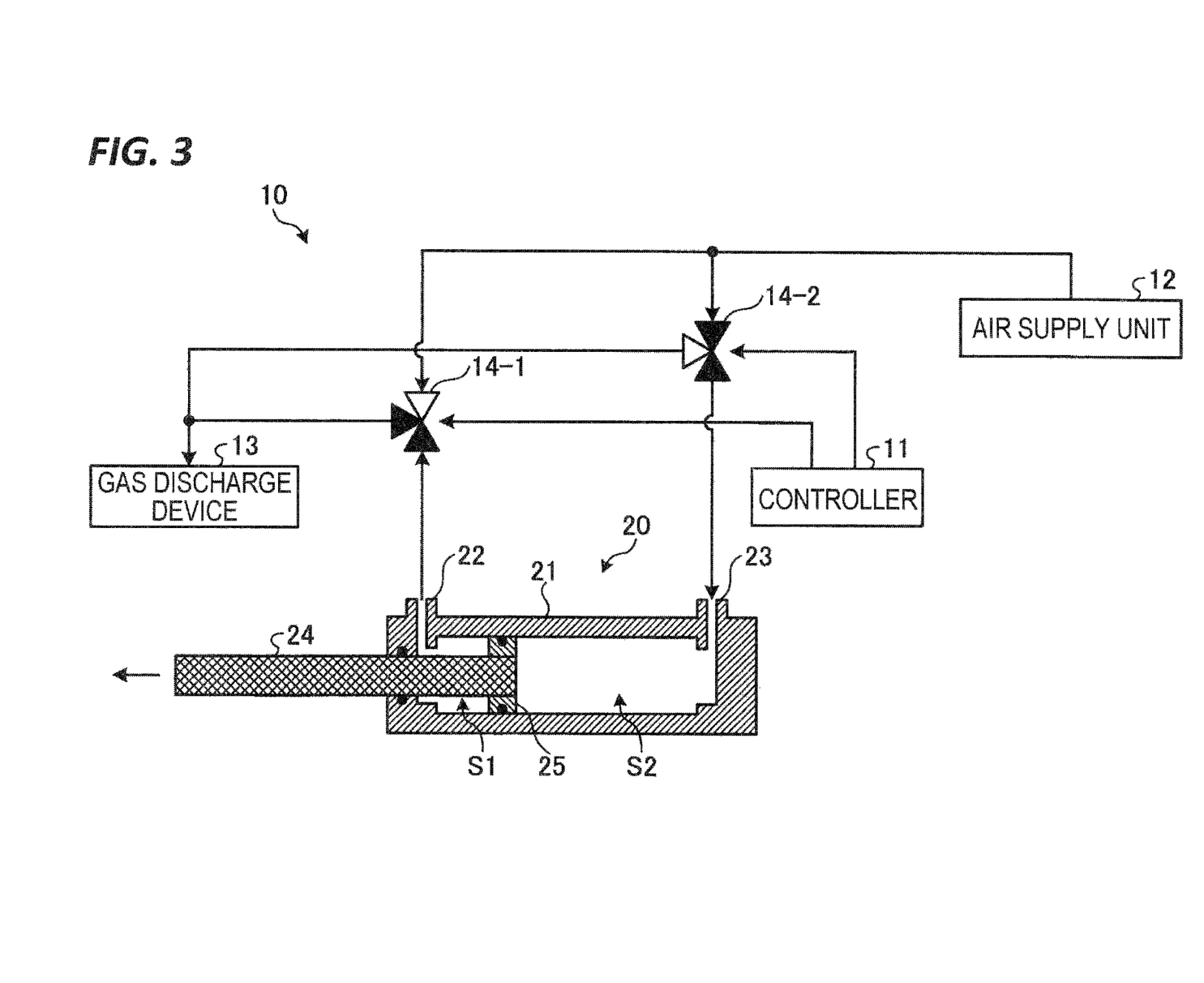
FIG. 3 is a view illustrating an example of a method of supplying and sucking compressed air when pushing out a piston rod according to Example 1.

When pushing out the piston rod 24, the controller 11 controls the respective valves 14, as illustrated in FIG. 3, for example. FIG. 3 is a view illustrating an example of a method of supplying and sucking compressed air when pushing out the piston rod 24 according to Example 1. In each of the valves 14 illustrated in FIG. 3, the port, which is indicated in black, is the port controlled so that the compressed air passes through the port, and the port, which is indicated in white, is the port controlled so that the compressed air is blocked.

When pushing out the piston rod 24, the controller 11 controls the valve 14-1 so that the valve 14-1 is in the second state, and controls the valve 14-2 so that the valve 14-2 is in the first state, as illustrated in FIG. 3, for example. Specifically, the controller 11 controls the valve 14-1 so that the port connected to the gas discharge device 13 and the port connected to the port 22 of the air cylinder main body 20 are in communication with each other, and controls the valve 14-2 so that the port connected to the air supply unit 12 and the port connected to the port 23 of the air cylinder main body 20 are in communication with each other.

Therefore, the compressed air outputted from the air supply unit 12 is supplied into the space S2 in the cylinder 21 through the valve 14-2 and the port 23, and force is applied to the piston 25, in the direction in which the piston rod 24 is pushed out, by the compressed air supplied into the space S2. In addition, the compressed air in the space S1 in the cylinder 21 is sucked by the gas discharge device 13 through the port 22 and the valve 14-1 such that the pressure in the space S1 becomes approximate to the vacuum pressure. Therefore, a surface of the piston 25, which is at the side of the space S1, is pulled to the side of the space S1. Therefore, the piston 25 moves in the cylinder 21 toward the space S1, and the piston rod 24 is pushed out.

Here, thrust A in the direction in which the piston rod 24 is pushed out is expressed by the following Equation (1), for example.

$$A = S_{P1} \times P_C + S_{P2} \times P_0 - S_R \times P_0 \quad (1)$$

In Equation (1), $S_{P1}$ represents a cross-sectional area of the piston 25 in the extension direction of the piston rod 24, $S_R$ represents a cross-sectional area of the piston rod 24, and $S_{P2}$ represents an area obtained by subtracting $S_R$ from $S_{P1}$. In addition, in Equation (1), $P_C$ represents pressure of the compressed air, and $P_0$ represents atmospheric pressure. Further, the pressure $P_C$ represents gauge pressure, and the pressure $P_0$ represents absolute pressure.

In the present Example, the pressure in the space, which is sucked by the gas discharge device 13, is several tens of millitorrs, for example, that is, sufficiently low compared to the atmospheric pressure $P_0$ or the pressure $P_C$ of the compressed air such that the pressure in the space may approximate to 0. For example, assuming that a diameter of a cross section of the piston 25 is 20 mm and a diameter of a cross section of the piston rod 24 is 10 mm, the thrust A, in the direction in which the piston rod 24 is pushed out, against the pressure $P_C$ of the compressed air is illustrated in FIG. 4, for example.

Figure 4:
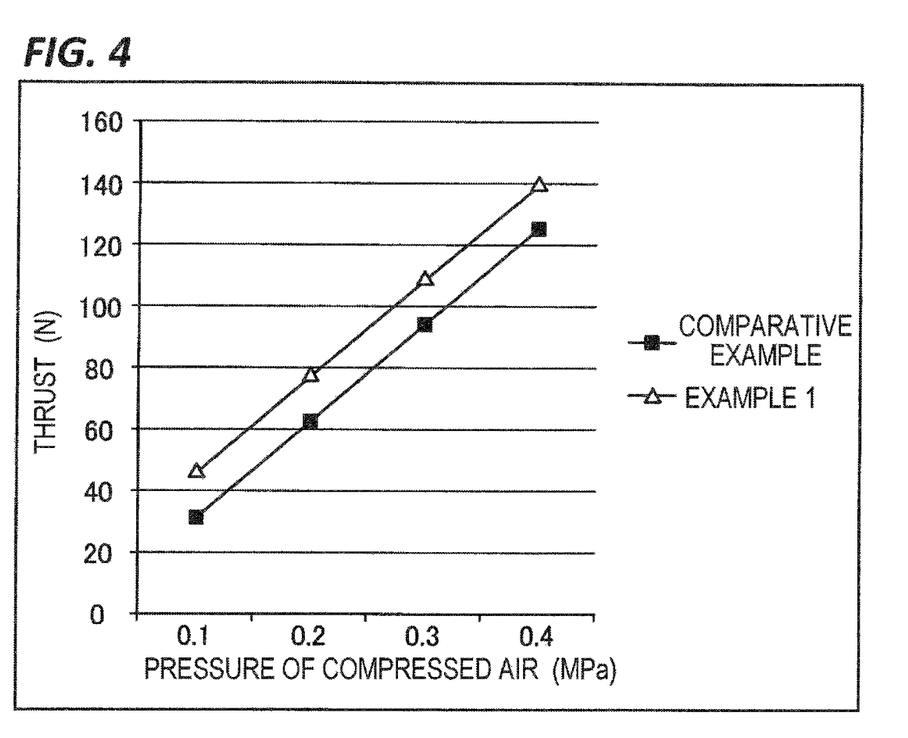
FIG. 4 is a view illustrating an example of a relationship between pressure of compressed air and thrust when pushing out the piston rod according to Example 1.

FIG. 4 is a view illustrating an example of a relationship between pressure of compressed air and thrust when pushing out the piston rod 24 according to Example 1. FIG. 4 illustrates thrust of the air cylinder having another configuration as a Comparative Example. In the air cylinder according to the Comparative Example, the air in the space S1 is not sucked by the gas discharge device 13, but the space S1 is opened to the atmosphere through the port 22.

Referring to FIG. 4, when the pressure $P_C$ of the compressed air is 0.1 MPa, the thrust is about 30 N in the Comparative Example, but in the air cylinder 10 according to the present Example, the thrust A in the direction in which the piston rod 24 is pushed out is increased to the extent that the air discharged from the interior of the cylinder 21 is sucked using the gas discharge device 13. In addition, both of the thrust of the air cylinder according to the Comparative Example and the thrust of the air cylinder 10 according to the present Example are increased as the pressure of the compressed air is increased, but at either pressure of the compressed air, the thrust of the air cylinder 10 according to the present Example is greater than the thrust of the air cylinder according to the Comparative Example.

Therefore, in a case in which the cylinder 21 having the inner diameter equal to the inner diameter of the cylinder according to the Comparative Example is used, the air cylinder 10 according to the present Example may have greater thrust than the air cylinder according to the Comparative Example. In addition, in a case in which the thrust equal to the thrust according to the Comparative Example is obtained, the cylinder 21 having the inner diameter smaller than the inner diameter of the cylinder according to the Comparative Example may be used such that the air cylinder main body 20 may be reduced in size. For this reason, the air cylinder 10 including the air cylinder main body 20 may be reduced in size such that a device in which the air cylinder 10 is incorporated may be reduced in size.

Figure 5:
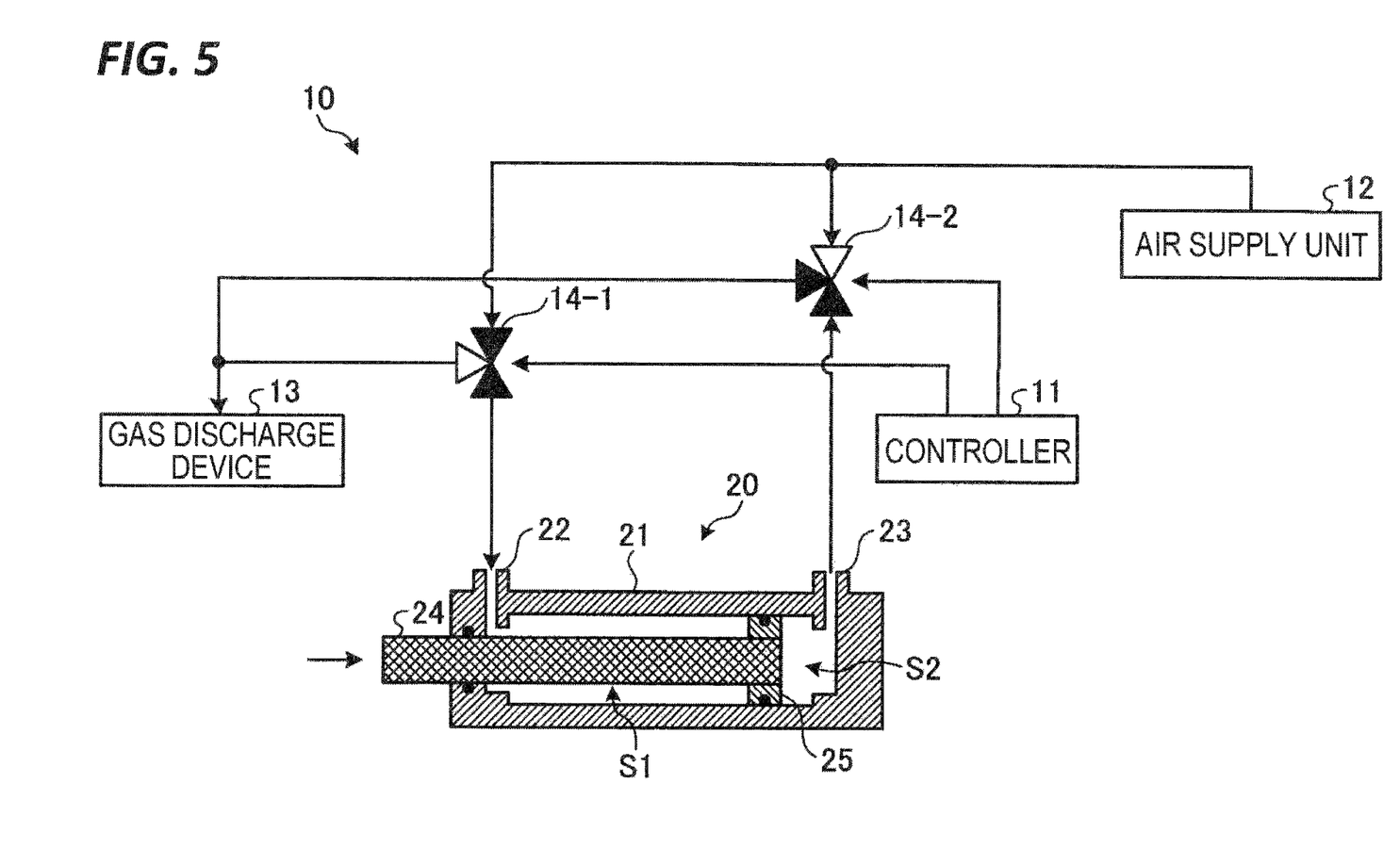
FIG. 5 is a view illustrating an example of a method of supplying and sucking compressed air when pulling back the piston rod according to Example 1.

When pulling back the piston rod 24, the controller 11 controls the respective valves 14, as illustrated in FIG. 5, for example. FIG. 5 is a view illustrating an example of a method of supplying and sucking compressed air when pulling back the piston rod 24 according to Example 1. When pulling back the piston rod 24, the controller 11 controls the valve 14-1 so that the valve 14-1 is in the first state, and controls the valve 14-2 so that the valve 14-2 is in the second state, as illustrated in FIG. 5, for example. Specifically, the controller 11 controls the valve 14-1 so that the port connected to the air supply unit 12 and the port connected to the port 22 of the air cylinder main body 20 are in communication with each other, and controls the valve 14-2 so that the port connected to the gas discharge device 13 and the port connected to the port 23 of the air cylinder main body 20 are in communication with each other.

Therefore, the compressed air outputted from the air supply unit 12 is supplied into the space S1 in the cylinder 21 through the valve 14-1 and the port 22, and force is applied to the surface of the piston 25 at the side of the space S1, by the compressed air supplied into the space S1, in the direction in which the piston rod 24 is pulled back. In addition, the compressed air in the space S2 in the cylinder 21 is sucked by the gas discharge device 13 through the port 23 and the valve 14-2 such that the pressure in the space S2 becomes approximate to the vacuum pressure. Therefore, the surface of the piston 25 at the side of the space S2, is pulled to the side of the space S2. Therefore, the piston 25 moves in the cylinder 21 toward the space S2, and the piston rod 24 is pulled back.

Thrust A' in the direction in which the piston rod 24 is pulled back is expressed by the following Equation (2), for example.

$$A' = S_{P2} \times P_C + S_{P1} \times P_0 \qquad (2)$$

Here, when pulling back the piston rod 24 in the air cylinder 10 according to the present Example, the compressed air is supplied into the space S1 from the port 22, and the air in the space S2 is sucked from the port 23 by the gas discharge device 13. Therefore, the air cylinder 10 according to the present Example may increase the thrust when pulling back the piston rod 24 in comparison with the air cylinder in which the port 23 is opened to the atmosphere. In addition, in a case in which the thrust equal to the thrust of the air cylinder in the related art is obtained, the cylinder 21 having the inner diameter smaller than the inner diameter of the air cylinder in the related art may be used in the air cylinder 10 according to the present Example such that the air cylinder main body 20 may be reduced in size. For this reason, the air cylinder 10 including the air cylinder main body 20 may be reduced in size such that a device in which the air cylinder 10 is incorporated may be reduced in size.

The air cylinder 10 according to the present Example is a so-called double-action air cylinder in which the compressed air is supplied into the space S2 and the air is sucked from the interior of the space S1 using the gas discharge device 13 when pushing out the piston rod 24, and the compressed air is supplied into the space S1 and the air is sucked from the interior of the space S2 using the gas discharge device 13 when pulling back the piston rod 24. However, the disclosed technology may also be applied to a so-called single-action air cylinder in which the compressed air is supplied and the air is sucked by the gas discharge device 13 when performing any of the operations of pushing out and pulling back the piston rod 24.

Example 2

[Configuration of Air Cylinder 10]

Figure 6:
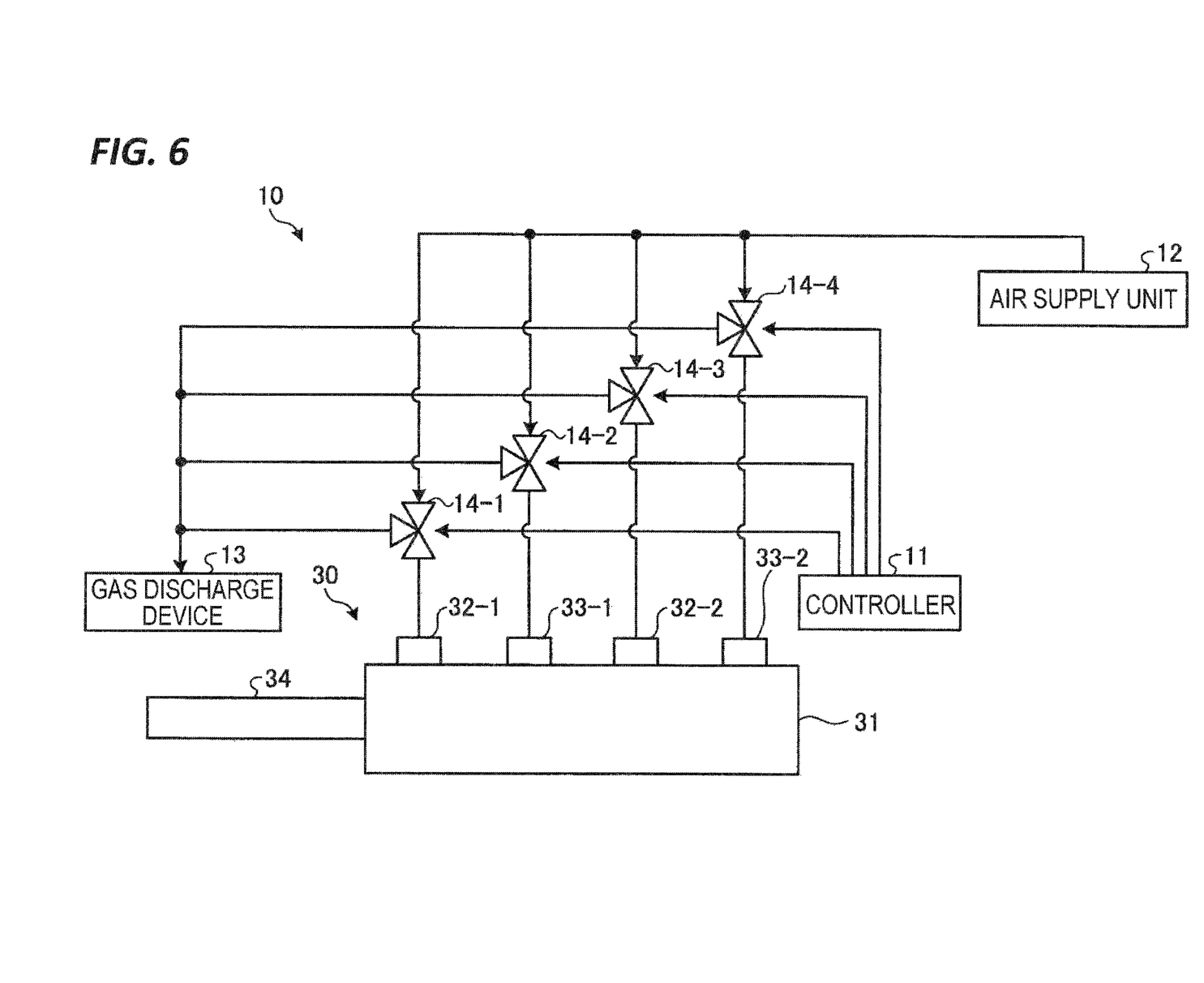
FIG. 6 is a block diagram illustrating an example of an air cylinder according to Example 2.

FIG. 6 is a block diagram illustrating an example of an air cylinder 10 according to Example 2. In the present Example, as illustrated in FIG. 6 for example, the air cylinder 10 has a controller 11, an air supply unit 12, a plurality of valves 14-1 to 14-4, and an air cylinder main body 30. Further, hereinafter, the valves 14-1 to 14-4 are simply referred to as valves 14 when the valves 14-1 to 14-4 are not distinguished from one another but collectively referred. In addition, because the blocks indicated in FIG. 6 by the same reference numerals as the blocks in FIG. 1 have equal and the same functions as the blocks in FIG. 1 except for the following description, descriptions thereof will be omitted.

The air cylinder main body 30 has a cylinder 31 and a piston rod 34. The cylinder 31 is provided with a plurality of ports 32-1 and 32-2 and a plurality of ports 33-1 and 33-2. Further, hereinafter, the plurality of ports 32-1 and 32-2 are simply referred to as ports 32 when the plurality of ports 32-1 and 32-2 are not distinguished from each other but collectively referred, and the plurality of ports 33-1 and 33-2 are simply referred to as ports 33 when the plurality of ports 33-1 and 33-2 are not distinguished from each other but collectively referred.

Compressed air is supplied into the cylinder 31 from one of the ports 32 and 33, and air in the cylinder 31 is sucked from the other of the ports 32 and 33. Even in the present Example, the air in the cylinder 31 is sucked by a gas discharge device 13. In the example in FIG. 6, the compressed air is supplied into the cylinder 31 from the respective ports 33, and the air in the cylinder 31 is sucked from the respective ports 32 such that the piston rod 34 is pushed out from the cylinder 31. Meanwhile, the air in the cylinder 31 is sucked from the respective ports 33, and the compressed air is supplied into the cylinder 31 from the respective ports 32 such that the piston rod 34 is pulled back into the cylinder 31.

[Configuration of Air Cylinder Main Body 30]

Figure 7:
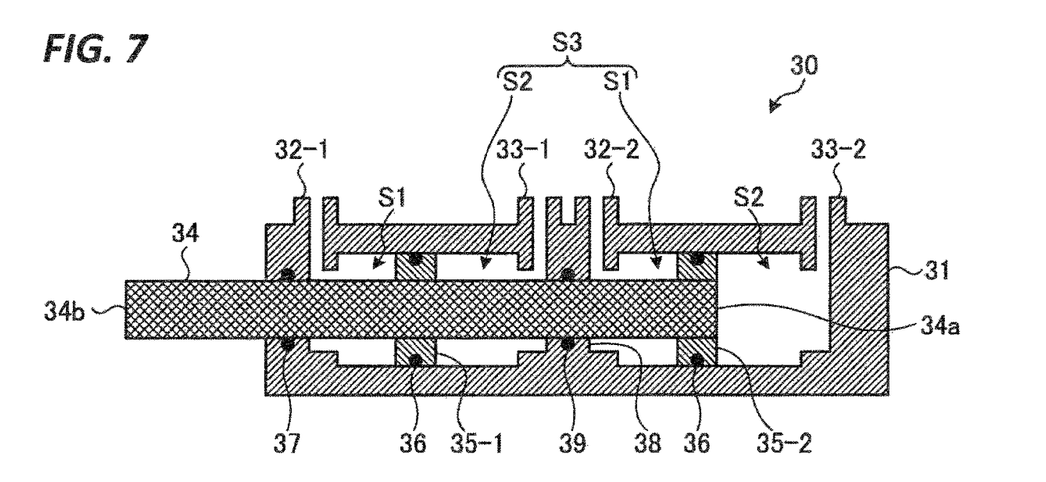
FIG. 7 is a cross-sectional view illustrating an example of an air cylinder main body according to Example 2.

FIG. 7 is a cross-sectional view illustrating an example of the air cylinder main body 30 according to Example 2. In the present Example, the air cylinder main body 30 has the cylinder 31 and the piston rod 34. The cylinder 31 is provided with the plurality of ports 32 and the plurality of ports 33. For example, as illustrated in FIG. 7, one end 34a of the piston rod 34 is disposed in the cylinder 31, and the other end 34b of the piston rod 34 protrudes from the cylinder 31. A seal member 37 is disposed between the cylinder 31 and the piston rod 34, and hermeticity of a space in the cylinder 31 is maintained by the seal member 37 even when the piston rod 34 moves.

The piston rod 34 is provided with a plurality of pistons 35-1 and 35-2. The piston 35-2 is provided at one end 34a of the piston rod 34, and the piston 35-1 is provided in the cylinder 31 at a position between the one end 34a and the other end 34b of the piston rod 34. Further, hereinafter, the pistons 35-1 and 35-2 are simply referred to as pistons 35 when the pistons 35-1 and 35-2 are not distinguished from each other but collectively referred.

A seal member 36 such as, for example, an O-ring is provided around an outer circumference of each of the pistons 35, and the seal member 36 is closely attached to the outer circumference of each of the pistons 35 and an inner surface of the cylinder 31. By the pistons 35 and the seal members 36, the space in the cylinder 31 is hermetically divided into spaces S1 which are at the side of the other end 34b of the piston rod 34 with respect to the pistons 35, and spaces S2 which are opposite to the spaces S1 with respect to the pistons 35.

The cylinder 31 has therein a space S3 formed to be surrounded by the inner wall of the cylinder 31 and the two adjacent pistons 35 in the extension direction of the piston rod 34. In addition, a partition wall 38, which divides the space S3 in the extension direction of the piston rod 34, is provided in the cylinder 31. Based on the partition wall 38, the space S1 is a space in the cylinder 31 at the side of the one end 34a of the piston rod 34 (i.e., a side where the piston 35-2 is provided), and the space S2 is a space in the cylinder 31 at the side of the other end 34b of the piston rod 34 (i.e., a side where the piston 35-1 is provided). A seal member 39 such as, for example, an O-ring is provided between the partition wall 38 and the piston rod 34, and the seal member 39 is closely attached to the partition wall 38 and the outer circumference of the piston rod 34. By the partition wall 38 and the seal member 39, the space S3 between the two adjacent pistons 35 is hermetically divided into the space S1 and the space S2.

A lubricant is applied onto the outer circumference of the piston rod 34. Therefore, the piston rod 34 may move in the cylinder 31 in the extension direction of the piston rod 34 while the space S1 and the space S2 are hermetically defined by the partition wall 38 and the seal member 39.

In the example in FIG. 7, the port 32-1 is in communication with the space S1, which is at the side of the other end 34b of the piston rod 34 with respect to the piston 35-1, and the port 33-1 is in communication with the space S2, which is at the side of the one end 34a of the piston rod 34 with respect to the piston 35-1. In addition, the port 32-2 is in communication with the space S1, which is at the side of the other end 34b of the piston rod 34 with respect to the piston 35-2, and the port 33-2 is in communication with the space S2, which is at the side of the one end 34a of the piston rod 34 with respect to the piston 35-2.

[Operation of Air Cylinder 10]

Figure 8:
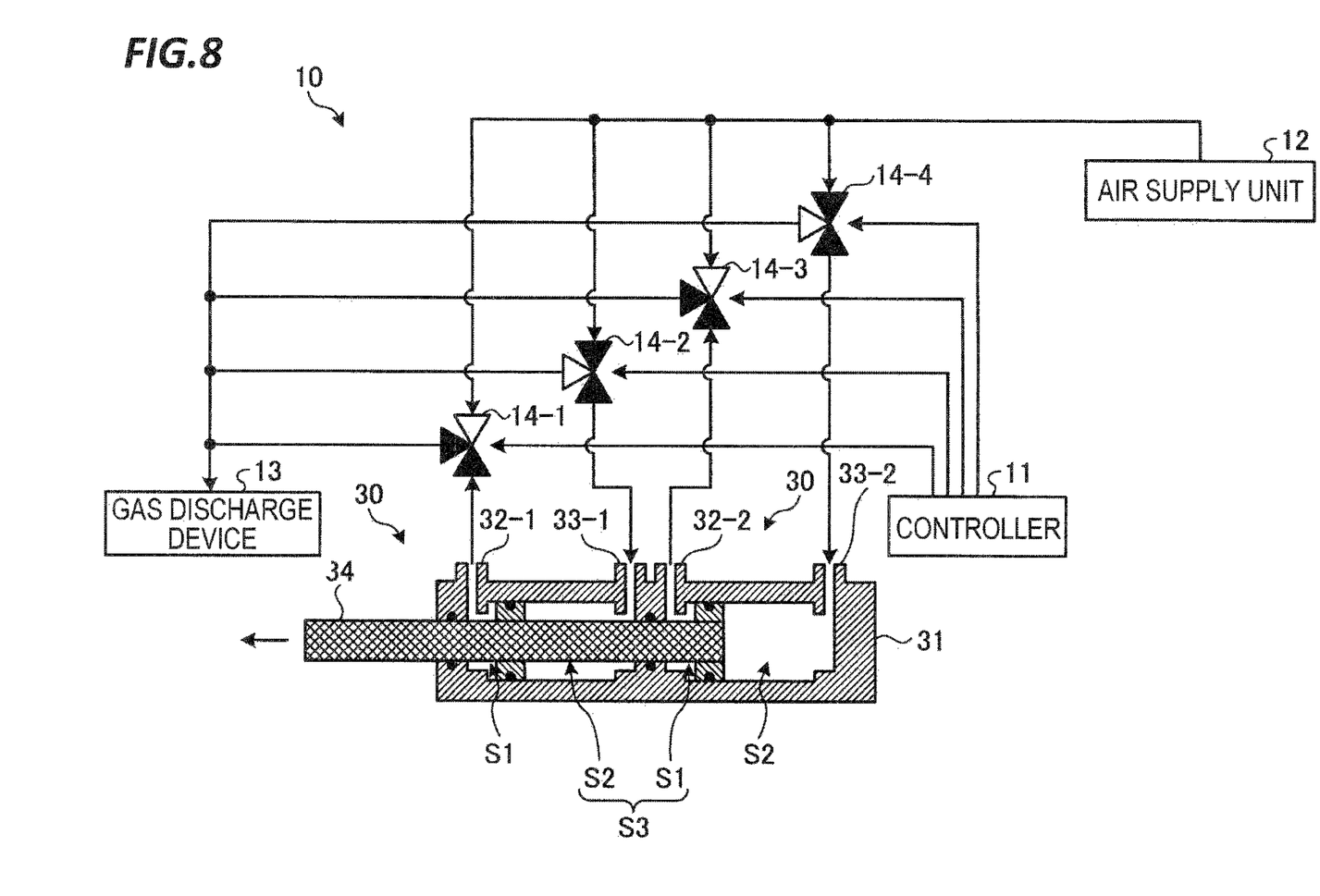
FIG. 8 is a view illustrating an example of a method of supplying and sucking compressed air when pushing out a piston rod according to Example 2.

When pushing out the piston rod 34, the controller 11 controls the respective valves 14, as illustrated in FIG. 8, for example. FIG. 8 is a view illustrating an example of a method of supplying and sucking compressed air when pushing out the piston rod 34 according to Example 2. In the present Example, when pushing out the piston rod 34, the controller 11 controls the valves 14-1 and 14-3 so that the valves 14-1 and 14-3 are in the second state, and controls the valves 14-2 and 14-4 so that the valves 14-2 and 14-4 are in the first state, as illustrated in FIG. 8, for example. Specifically, the controller 11 controls the respective valves 14-1 and 14-3 so that the port connected to the gas discharge device 13 and the port connected to each of the ports 32 of the air cylinder main body 30 are in communication with each other. In addition, the controller 11 controls the respective valves 14-2 and 14-4 so that the port connected to the air supply unit 12 and the port connected to each of the ports 33 of the air cylinder main body 30 are in communication with each other.

Therefore, the compressed air outputted from the air supply unit 12 is supplied into the spaces S2 in the cylinder 31 from the respective ports 33 through the valves 14-2 and 14-4, and force is applied to the respective pistons 35, in the direction in which the piston rod 34 is pushed out, by the compressed air supplied into the spaces S2. In addition, the air in the spaces S1 in the cylinder 31 is sucked by the gas discharge device 13 from the respective ports 32 through the valves 14-1 and 14-3 such that the pressure in the spaces S1 becomes approximate to the vacuum pressure. Therefore, surfaces of the respective pistons 35, which are at the side the spaces S1, are pulled to the side of the spaces S1. Therefore, the respective pistons 35 move in the cylinder 31 toward the spaces S1, and the piston rod 34 is pushed out.

Here, in the present Example, thrust A in the direction in which the piston rod 34 is pushed out is expressed by the following Equation (3), for example.

$$A = \{S_{P1} + S_{P2}\} \times P_C + 2 \times P_0 \times (S_{P2} - S_R) \quad (3)$$

In the above Equation (3), $S_R$ represents a cross-sectional area of the piston rod 34.

Figure 9:
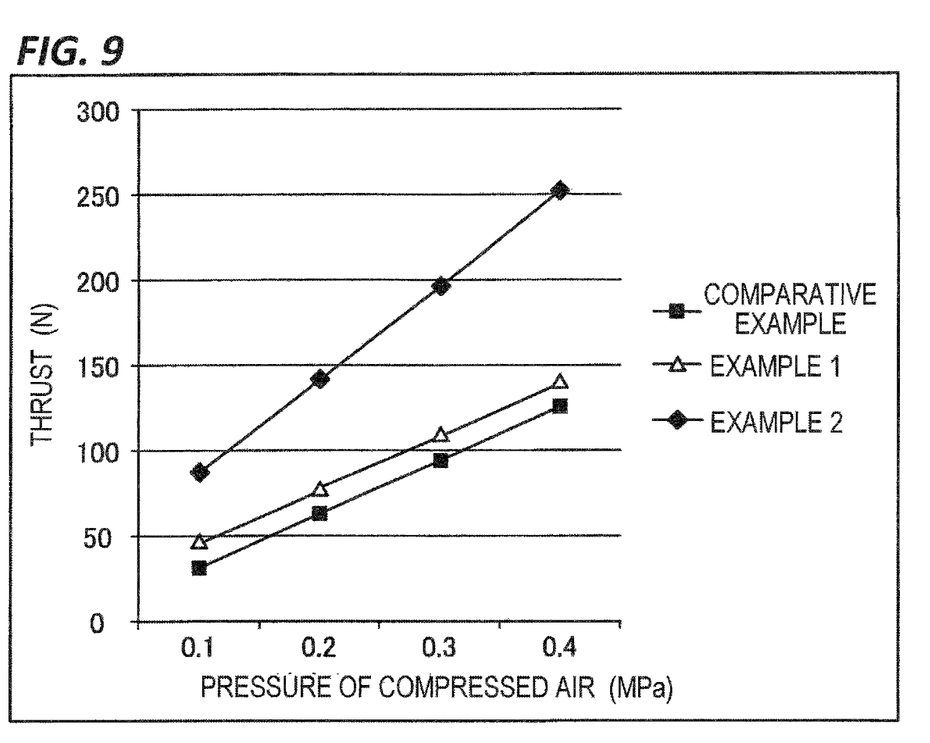
FIG. 9 is a view illustrating an example of a relationship between pressure of compressed air and thrust when pushing out the piston rod according to Example 2.

In the present Example, for example, assuming that a diameter of a cross-sectional area of the piston 35 in the extension direction of the piston rod 34 is 20 mm and a diameter of a cross section of the piston rod 34 is 10 mm, the thrust A, against the pressure of the compressed air, in the direction in which the piston rod 34 is pushed out is the same as that in FIG. 9, for example. FIG. 9 is a view illustrating an example of a relationship between pressure of compressed air and thrust when pushing out the piston rod 34 according to Example 2. FIG. 9 also illustrates both the thrust of the air cylinder according to the Comparative Example and the thrust of the air cylinder 10 according to Example 1.

In the air cylinder 10 according to the present Example, the plurality of pistons 35 are provided on the piston rod 34, and the compressed air is supplied and the air is sucked by the gas discharge device 13 with respect to the respective pistons 35. Therefore, the air cylinder 10 according to the present Example may increase the thrust A in comparison with the Comparative Example, as illustrated in FIG. 9, for example. In addition, the air cylinder 10 according to the present Example may increase the thrust in comparison with the air cylinder in Example 1.

Figure 10:
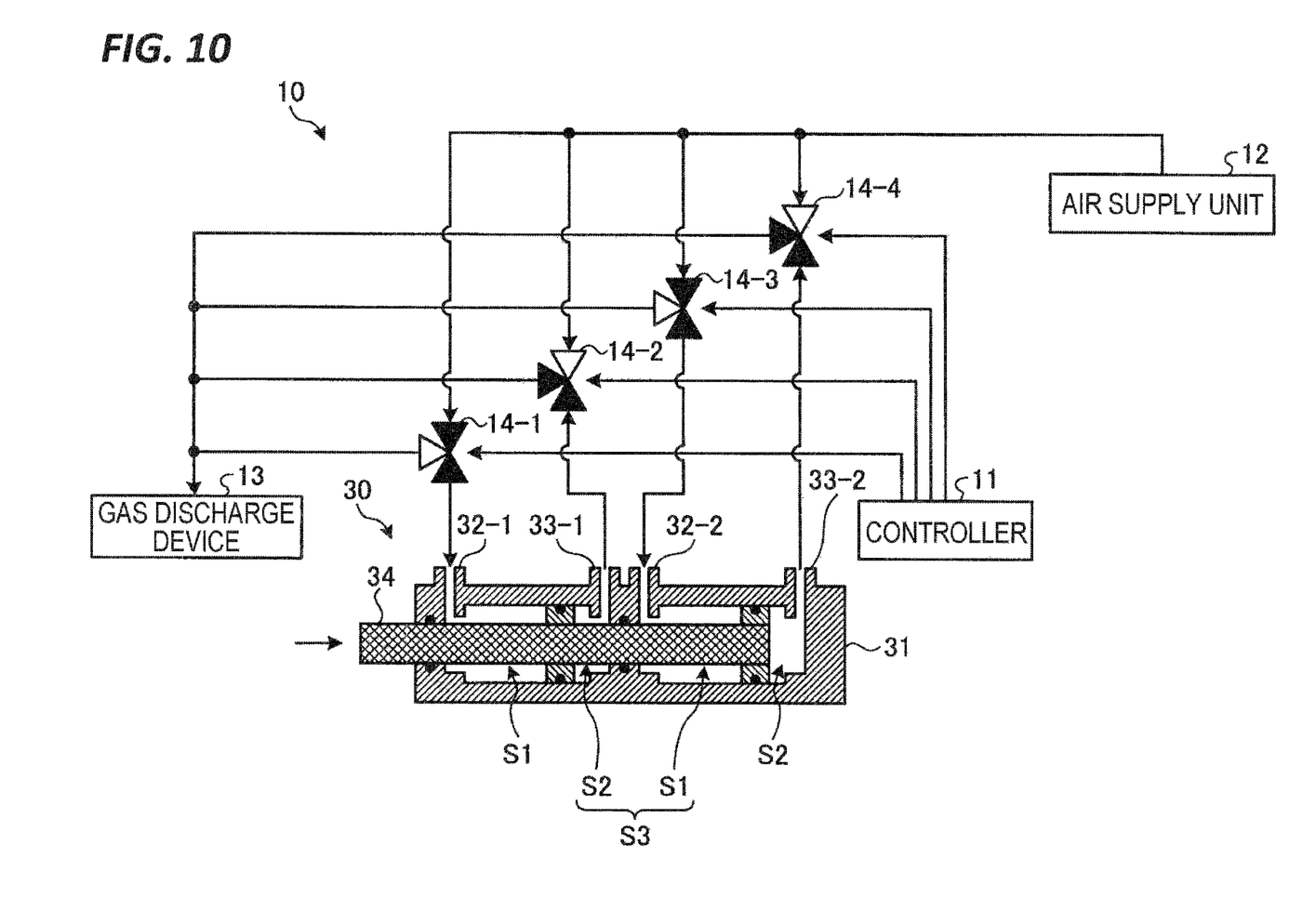
FIG. 10 is a view illustrating an example of a method of supplying and sucking compressed air when pulling back the piston rod according to Example 2.

When pulling back the piston rod 34, the controller 11 controls the respective valves 14, as illustrated in FIG. 10, for example. FIG. 10 is a view illustrating an example of a method of supplying and sucking compressed air when pulling back the piston rod 34 according to Example 2. In the present Example, when pulling back the piston rod 34, the controller 11 controls the valves 14-1 and 14-3 so that the valves 14-1 and 14-3 are in the first state, and controls the valves 14-2 and 14-4 so that the valves 14-2 and 14-4 are in the second state, as illustrated in FIG. 10, for example. Specifically, the controller 11 controls the respective valves 14-1 and 14-3 so that the port connected to the air supply unit 12 and the port connected to each of the ports 32 of the air cylinder main body 30 are in communication with each other. In addition, the controller 11 controls the respective valves 14-2 and 14-4 so that the port connected to the gas discharge device 13 and the port connected to each of the ports 33 of the air cylinder main body 30 are in communication with each other.

Therefore, the compressed air outputted from the air supply unit 12 is supplied into the spaces S1 in the cylinder 31 from the respective ports 32 through the valves 14-1 and 14-3, and force is applied to the respective pistons 35, in the direction in which the piston rod 34 is pulled back, by the compressed air supplied into the spaces S1. In addition, the air in the spaces S2 in the cylinder 31 is sucked by the gas discharge device 13 from the respective ports 33 through the valves 14-2 and 14-4 such that the pressure in the spaces S2 becomes approximate to the vacuum pressure. Therefore, the surfaces of the respective pistons 35, which are at the side of the spaces S2, are pulled to the side of the spaces S2. Therefore, the respective pistons 35 move in the cylinder 31 toward the spaces S2, and the piston rod 34 is pulled back.

In the present Example, thrust A' in the direction in which the piston rod 34 is pulled back is expressed by the following Equation (4), for example.

$$A' = 2 \times S_{P2} \times P_C + S_{P1} \times P_0 + S_{P2} \times P_0 - S_R \times P_0 \quad (4)$$

Here, when pulling back the piston rod 34 in the air cylinder 10 according to the present Example, the compressed air is supplied into the spaces S1 from the ports 32, and the air in the spaces S2 is sucked from the ports 33 by the gas discharge device 13. Therefore, the air cylinder 10 according to the present Example may further increase the thrust when pulling back the piston rod 34 in comparison with the air cylinder in the related art in which the port 33 is opened to the atmosphere.

The air cylinder 10 according to the present Example is a so-called double-action air cylinder in which the compressed air is supplied into the respective spaces S2 and the air is sucked from the interior of the respective spaces S1 using the gas discharge device 13 when pushing out the piston rod 34, and the compressed air is supplied into the respective spaces S1 and the air is sucked from the interior of the respective spaces S2 using the gas discharge device 13 when pulling back the piston rod 34. However, the disclosed technology may also be applied to a so-called single-action air cylinder in which the compressed air is supplied and the air is sucked by the gas discharge device 13 when performing any of the operations of pushing out and pulling back the piston rod 34.

The respective examples of the air cylinder 10 have been described above. As apparent from the above description, according to the air cylinder 10 according to the respective examples, it is possible to increase thrust of the air cylinder. In addition, according to the air cylinder 10 according to the respective examples, it is possible to realize the thrust equal to the thrust in the related art using the air cylinder 10 that has a smaller size than the air cylinder in the related art.

[Others]

The disclosed technology is not limited to the aforementioned Examples and may be variously modified within the scope of the subject matter thereof.

For example, in the respective examples, the compressed dry air is used as the gas to be supplied into the air cylinder main body 20 or the air cylinder main body 30, but the disclosed technology is not limited thereto. As another example, any compressed gas may be supplied into the air cylinder main body 20 or the air cylinder main body 30 in accordance with an environment in which the air cylinder 10 is used.

Figure 11:
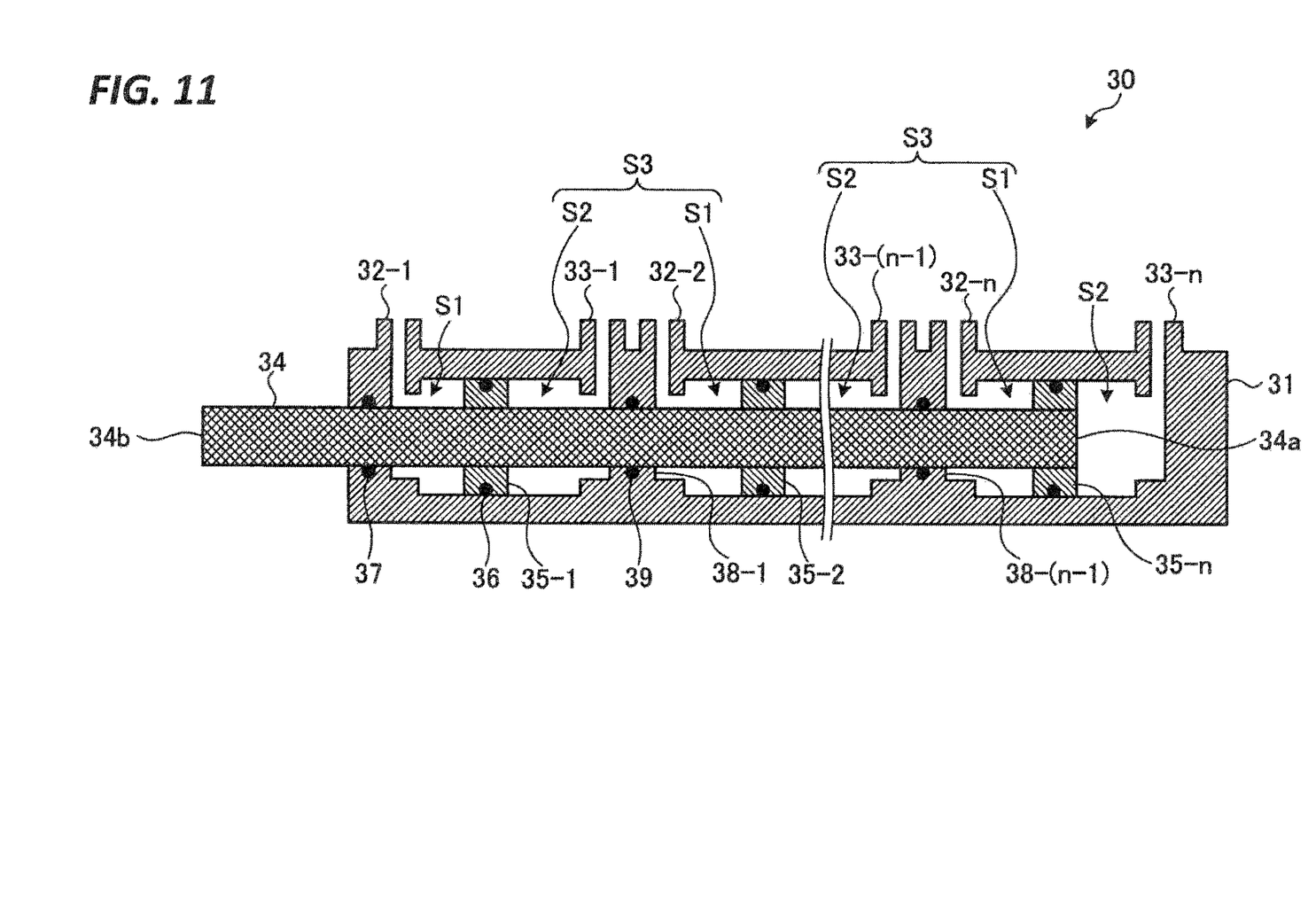
FIG. 11 is a cross-sectional view illustrating another example of the air cylinder main body according to Example 2.

In the aforementioned Example 2, the air cylinder main body 30 having the two pistons 35-1 and 35-2 provided on the piston rod 34 has been described as an example, but the disclosed technology is not limited thereto. As another example of the air cylinder main body 30, n (n is an integer of 3 or more) pistons 35 may be provided on the piston rod 34, as illustrated in FIG. 11, for example. FIG. 11 is a cross-sectional view illustrating another example of the air cylinder main body 30 according to Example 2.

In this case, (n−1) partition walls 38, which divide the space S3 surrounded by the inner wall of the cylinder 31 and the two adjacent pistons 35 in the extension direction of the piston rod 34, are provided in the cylinder 31 in which a partition wall 38 is provided every two pistons 35 adjacent in the extension direction of the piston rod 34. In the space S3, the space in the cylinder 31 on the side of the one end 34a of the piston rod 34 with respect to the partition wall 38 is the space S1, and the space in the cylinder 31 on the side of the other end 34b of the piston rod 34 is the space S2.

In the air cylinder 10 illustrated in FIG. 11, thrust A in the direction in which the piston rod 34 is pushed out is expressed by the following Equation (5), for example.

$$A = \{S_{P1} + (n-1) \times S_{P2}\} \times P_C + n \times P_0 \times (S_{P2} - S_R) \quad (5)$$

In the air cylinder 10 illustrated in FIG. 11, thrust A' in the direction in which the piston rod 34 is pulled back is expressed by the following Equation (6), for example.

$$A' = n \times S_{P2} \times P_C + P_0 \times \{S_{P1} + (n-1) \times (S_{P2} - S_R)\} \quad (6)$$

Even in the case of the air cylinder 10 illustrated in FIG. 11, it is possible to increase the thrust of the air cylinder.

The two ports, which are used to supply and suck the compressed air, are provided for the spaces S1 and S2, respectively, one by one, in the cylinder 21 in the aforementioned Example 1, but the plurality of ports may be provided for the space S1, and the plurality of ports may be provided for the space S2. Similarly, the two ports, which are used to supply and suck the compressed air, are provided for the respective spaces S1 and S2, respectively, one by one, in the cylinder 31 even in the aforementioned Example 2, but the plurality of ports may be provided for the respective spaces S1, and the plurality of ports may be provided for the respective spaces S2.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A gas cylinder comprising:
   a cylinder;
   a piston rod having one end enclosed within the cylinder and a remaining end protruding from the cylinder;
   a piston provided at the one end of the piston rod and configured to move the piston rod by moving in the cylinder;
   a first and second valves;
   an air supplier to supply a compressed gas;
   a vacuum pump configured to remove the compressed gas; and
   a gas controller configured to, in a first mode, supply a compressed gas into a first space from the air supplier through the first valve, the first space being a space in the cylinder on a side of the piston rod with respect to the piston, and suck gas from an interior of a second space through the second valve to the vacuum pump, the second space being a space in the cylinder opposite to the first space with respect to the piston, and, in a second mode, suck the gas from an interior of the first space through the first valve to the vacuum pump and supply the compressed gas into the second space through the second valve from the air supplier,
   wherein the first valve is not directly connected to the second valve.

2. The gas cylinder of claim 1, wherein a partition wall is provided in the cylinder so as to generate a third space between the first space and the second space.

3. The gas cylinder of claim 1, wherein the gas controller sucks the gas from the interior of the first space and supplies the compressed gas into the second space when the piston rod is moved in a direction where the remaining end of the piston rod is moved away from the cylinder.

4. The gas cylinder of claim 1, wherein the gas controller supplies the compressed gas into the first space and sucks the gas from the interior of the second space when the piston rod is moved in a direction where the remaining end of the piston rod is moved toward the cylinder.

5. The gas cylinder of claim 1, wherein the gas controller sucks the gas from the space in the cylinder using the vacuum pump.

6. The gas cylinder of claim 1, wherein the gas is dry air.

7. The gas cylinder of claim 1, wherein a seal member is disposed between the cylinder and the piston rod.

8. The gas cylinder of claim 1, wherein a lubricant is applied on a surface of the outer circumference of the piston rod.

9. The gas cylinder of claim 1, wherein the vacuum pump is a dry pump (DP) or a turbo molecular pump (TMP).

10. A method of operating a gas cylinder including a cylinder, a piston rod having one end enclosed within the cylinder and a remaining end protruding from the cylinder, a piston provided at the one end of the piston rod and configured to move the piston rod by moving inside the cylinder, the method comprising:
- in a first mode, supplying a compressed gas into a first space, from an air supplier through a first valve, the first space being a space in the cylinder on a side of the piston rod with respect to the piston, and sucking gas from an interior of a second space, through a second valve to a vacuum pump, the second space being a space in the cylinder opposite to the first space with respect to the piston at the same time, thereby pressing out the piston rod; and
- in a second mode, supplying the compressed gas into the second space through the second valve from the air supplier, and sucking gas from an interior of the first space through the first valve to the vacuum pump at the same time, thereby pulling back the piston rod,
- wherein the first valve is not directly connected to the second valve.

11. A gas cylinder comprising:
- a cylinder;
- a piston rod having one end enclosed within the cylinder and a remaining end protruding from the cylinder;
- a plurality of pistons each provided at the one end of the piston rod and at one or more positions between the one end and the remaining end of the piston rod, and configured to move the piston rod by moving in the cylinder;
- a first group of valves and a second group of valves;
- an air supplier to supply a compressed gas;
- a vacuum pump configured to remove the compressed gas;
- one or more partition walls each provided in the cylinder for every two adjacent pistons so as to divide a space surrounded by an inner wall of the cylinder and the two adjacent pistons in an extension direction of the piston rod; and
- a gas controller configured to, in a first mode, supply a compressed gas into a group of first spaces from the air supplier through the first group of valves, the group of first spaces being spaces in the cylinder on a side of the remaining end of the piston rod with respect to each of the pistons, and suck gas from an interior of each of a group of second spaces through the second group of valves to the vacuum pump, the group of second spaces being spaces in the cylinder opposite to the group of first spaces with respect to the each of the of pistons, respectively, and, in a second mode, suck the gas from an interior of each of the group of first spaces through the first group of valves to the vacuum pump and supply the compressed gas into the group of second spaces through the second group of valves from the air supplier,
- wherein the first valve is not directly connected to the second valve.

12. The gas cylinder of claim 11, wherein the space divided by one partition wall forms a first space and a second space, and the partition wall always seals the first space from the second space.

* * * * *